(12) United States Patent
Blanchard

(10) Patent No.: US 10,201,051 B1
(45) Date of Patent: Feb. 5, 2019

(54) ACTIVE LED MODULE WITH LED AND VERTICAL MOS TRANSISTOR FORMED ON SAME SUBSTRATE

(71) Applicant: Nthdegree Technologies Worldwide Inc., Tempe, AZ (US)

(72) Inventor: Richard A. Blanchard, Los Altos, CA (US)

(73) Assignee: NTHDEGREE TECHNOLOGIES WORLDWIDE INC., Tempe, AZ (US)

(*) Notice: Subject to any disclaimer, the term of this patent is extended or adjusted under 35 U.S.C. 154(b) by 0 days.

(21) Appl. No.: 16/003,544

(22) Filed: Jun. 8, 2018

Related U.S. Application Data

(60) Provisional application No. 62/655,726, filed on Apr. 10, 2018.

(51) Int. Cl.
 *H01L 27/15* (2006.01)
 *H01L 33/00* (2010.01)
 *H05B 33/08* (2006.01)
 *H01L 33/36* (2010.01)

(52) U.S. Cl.
 CPC ......... *H05B 33/0842* (2013.01); *H01L 33/36* (2013.01); *H05B 33/0824* (2013.01)

(58) Field of Classification Search
 CPC ....... H01L 27/15; H01L 27/153; H01L 33/00; H01L 33/30; H01L 33/36; H01L 33/38; H01L 2924/00; H01L 2924/13091; H01L 2924/13092
 See application file for complete search history.

(56) References Cited

U.S. PATENT DOCUMENTS

| | | | |
|---|---|---|---|
| 9,577,007 B2 | 2/2017 | Blanchard et al. | |
| 2007/0200134 A1* | 8/2007 | Therrien | H01L 29/2003 257/103 |
| 2011/0248302 A1* | 10/2011 | Choi | H01L 27/15 257/98 |
| 2013/0221368 A1* | 8/2013 | Oraw | H01L 27/15 257/76 |
| 2016/0277022 A1* | 9/2016 | Alexander | H01L 29/872 |

* cited by examiner

*Primary Examiner* — Thai Pham
(74) *Attorney, Agent, or Firm* — Patent Law Group LLP; Brian D. Ogonowsky

(57) ABSTRACT

An LED module is disclosed containing an integrated MOSFET driver transistor in series with an LED. In one embodiment, GaN-based LED layers are epitaxially grown over an interface layer on a silicon substrate. The MOSFET gate is formed in a trench in the silicon substrate and creates a vertical channel between a top source and a bottom drain when the gate is biased to turn on the LED. A conductor on the die connects the MOSFET in series with the LED. One power electrode is located on a top of the die, another power electrode is located on the bottom of the die, and the gate electrode may be on the top or the side of the die.

20 Claims, 4 Drawing Sheets

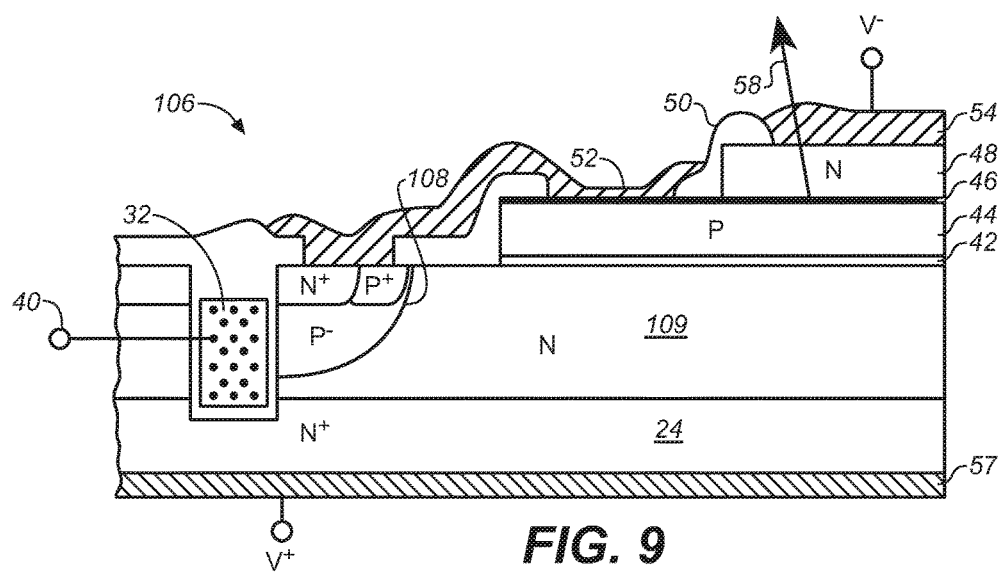
FIG. 9
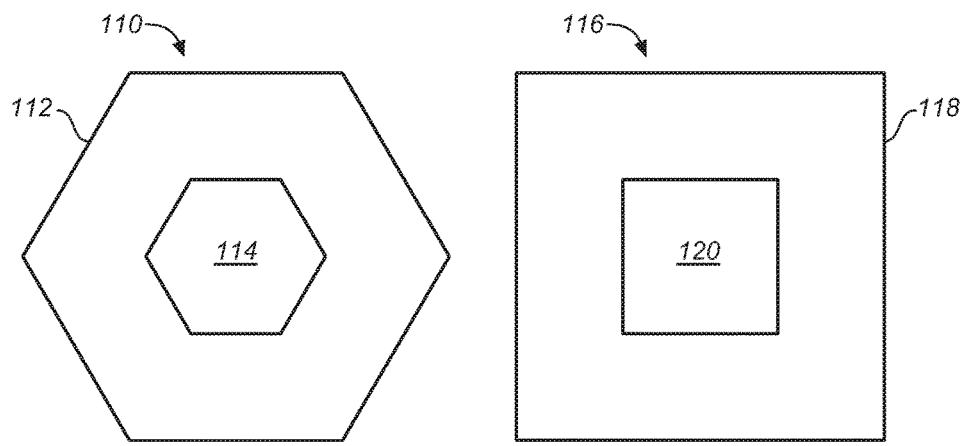
FIG. 10  FIG. 11

ACTIVE LED MODULE WITH LED AND VERTICAL MOS TRANSISTOR FORMED ON SAME SUBSTRATE

CROSS-REFERENCE TO RELATED APPLICATIONS

This application is based on, and claims priority to, U.S. provisional application Ser. No. 62/655,726, filed on Apr. 10, 2018, assigned to the present assignee and incorporated herein by reference.

FIELD OF THE INVENTION

This invention relates to light emitting diodes (LEDs) and, in particular, to a single die containing driver circuitry in series with an LED to control current through the LED.

BACKGROUND

LEDs are typically formed as dies having an anode terminal and a cathode terminal. An LED die is typically mounted on a larger substrate for heat dissipation and packaging. The substrate may contain additional circuitry, such as a passive electrostatic discharge device. The LED die and optional substrate are then typically packaged, where the package has robust anode and cathode leads for being soldered to a printed circuit board (PCB).

LEDs may be controlled by an external current source to achieve a desired brightness. The current source may be a MOSFET or a bipolar transistor formed in a separate die. The current source and LED are typically connected together by wires or a PCB.

Providing the current source separate from the LED die requires extra space and interconnections, adding cost. Other disadvantages exist, including the possibility of mismatching components.

The Applicant had previously invented a very compact LED module with an integrated driver transistor, disclosed in U.S. Pat. No. 9,577,007, incorporated herein by reference. In that patent, single-chip LED modules are described with an integrated, lateral-channel PMOS or NMOS transistor. The LED and MOSFET are connected in series on the die to form a 3-terminal device. The LED is turned on by controlling the gate of the MOSFET.

The LED and MOSFET are formed over the same substrate, such as a silicon substrate, an SiC substrate, a GaN substrate, or a sapphire substrate. In the case of a sapphire substrate, the sapphire substrate is removed so that the module can conduct current vertically. Although the MOSFET channels are lateral (using a top lateral gate), the current flow between the top LED electrode and the die's bottom electrode is vertical by using a vertical conductive path between the lateral channel and the bottom electrode. The vertical conductive path may be the doped substrate or a laser-drilled hole filled with a conductive material.

Since the channels are lateral (on the top surface of the die), the surface area of the module is relatively large, adding expense and size. This configuration may prevent the LED modules being used as compact pixels in a display. Further, the long vertical conduction path through the substrate material results in power loss. Laser-drilling holes through the substrate and filling the holes with a conductor add considerable expense.

What is needed is an improved LED module having a MOSFET and LED formed on the same substrate and connected in series, where current is conducted vertically between a bottom electrode and a top electrode, and where the LED module does not have the drawbacks discussed above.

SUMMARY

Various designs of a vertical channel MOSFET are described for use in an integrated LED module containing an LED and driver transistor in the same die. The vertical channel MOSFET has a high conductivity in the vertical direction and uses a trench that may be formed using a reactive ion etch (RIE). This results in a very compact and efficient LED module, enabling more LEDs to be fabricated on a single wafer. There is no need for laser drilling holes in a substrate.

The MOSFET may completely surround the LED formed in the center, or the LED may surround the MOSFET. In either case, the current through the MOSFET is uniformly supplied to the LED for substantially uniform brightness across the LED.

BRIEF DESCRIPTION OF DRAWINGS

FIG. 9 is similar to FIG. 2 but the NMOS driver transistor is formed as a DMOS transistor. All transistors may be DMOS transistors, using a double diffusion of dopants.

FIG. 10 is a top down view of an LED/driver die having a hexagonal footprint, where either the MOSFET driver portion surrounds the LED portion for uniform injection of current into the LED, or the LED portion surrounds the MOSFET driver portion for uniform injection of current into the LED.

FIG. 11 is a top down view of an LED/driver die having a square footprint, where the MOSFET driver portion surrounds the LED portion for uniform injection of current into the LED, or the LED portion surrounds the MOSFET driver portion for uniform injection of current into the LED.

Elements that are the same or similar in the figures are labeled with the same numeral.

DETAILED DESCRIPTION

Figure 1:
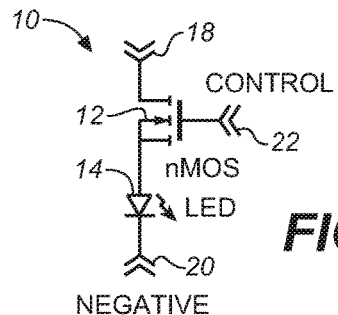
FIG. 1 is a schematic diagram of an NMOS driver transistor connected to the anode of an LED.

FIG. 1 is a schematic diagram of one embodiment of the inventive LED module 10 formed as a single die that is singulated from a wafer. On the die is formed an NMOS transistor 12 in series with an LED 14. For purposes of illustration, the LED 14 will be shown formed on the top of the die so that light is emitted from the top of the die. An anode electrode 18 on one surface of the die is connected to a positive voltage, and a cathode electrode 20 formed on the opposite surface is connected to a negative voltage, relative to the anode voltage. A control terminal 22 may be accessed from the top or the side to control the current through the transistor 12 and thus the brightness of the LED 14. In one embodiment, the LED 14 is GaN-based and emits blue or UV light. A phosphor or quantum dots may be deposited over the LED 14 to create a wide range of colors.

Figure 2:
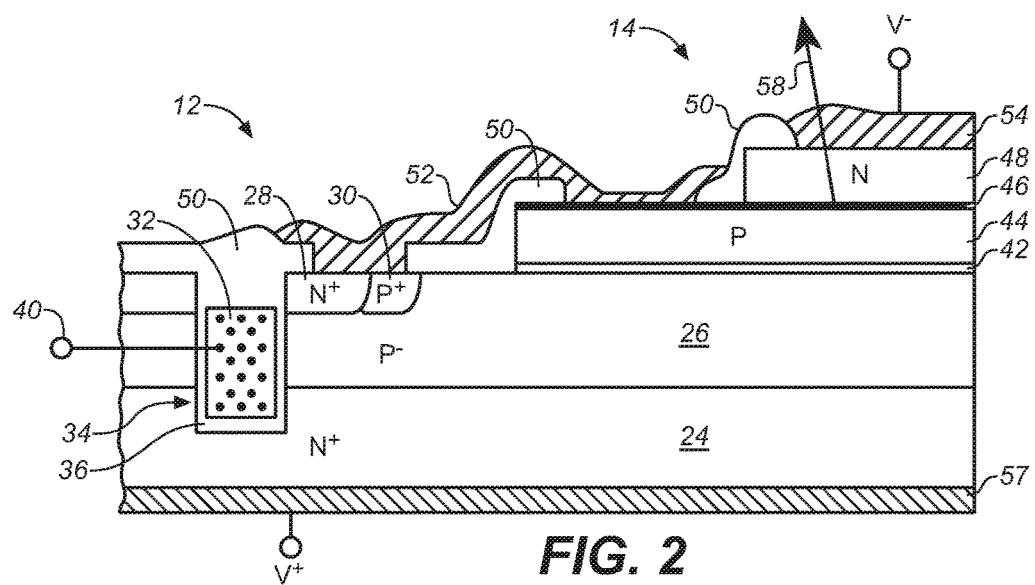
FIG. 2 is a cross-sectional view of a portion of an LED/driver module, where a trenched vertical NMOS driver transistor is used, corresponding to the diagram of FIG. 1.

FIG. 2 is one embodiment of the circuit of FIG. 1 formed as a die. The center line of the die may be either through the LED or through the MOSFET, depending on which portion surrounds the other.

In the example, the substrate 24 is N+ type silicon. The substrate 24 acts as a drain. Over the substrate 24 is formed a lightly doped P– body region 26, such as by in-situ doping during epitaxial growth or implantation of P-type dopants into the surface of the substrate 24. A highly doped N+ source region 28 is then formed in the top surface along with a P+ body contact region 30. Although the source and contact regions 28 and 30 are shown on the "inner" side of the vertical gate 32, the regions 28 and 30 may be on both sides of the gate 32 or just on the "outer" side. Since the voltage may be low, the layers may be thin.

The substrate in all versions may consist of a lightly doped layer over a more heavily doped layer of the same conductivity. Further, in all versions, the substrate may be eventually thinned by grinding after forming the various semiconductor layers.

A gate trench 34 is then formed by masking and etching using RIE. The trench 34 extends from the top surface to the N+ substrate 24. The trench walls are then oxidized, or otherwise insulated, to form a thin gate oxide layer 36, followed by at least partially filling the trench 34 with a doped polysilicon to form the conductive gate 32.

The trench 34 polysilicon leads to a metal gate electrode 40 that may be anywhere on the top surface of the die or even a side electrode for minimizing the surface real estate.

The trench 34, source region 28, and body contact region 30 surrounds a center LED 14 to uniformly inject current into the LED 14 for a uniform brightness across the LED 14. The right side of the figure may be the centerline of the die. If the LED is surrounded by the MOSFET then, after the LED layers are grown to form the LED portion, a perimeter area of the LED is etched away to expose a semiconductor surface in which the transistor regions and trench are formed.

In another embodiment, the MOSFET driver portion forms the middle portion of the die surrounded by the LED portion. If the MOSFET is surrounded by the LED then, after the LED layers are grown to form the LED portion, a central area of the LED is etched away to expose a semiconductor surface in which the transistor regions and trench are formed.

The substrate 24 may be silicon or any other suitable material to form a vertical MOSFET. The LED 14 may be formed of a material that is independent of the substrate 24 material.

Over the top surface of the body region 26 is an insulating interface layer 42. The interface layer 42 is needed to interface the crystal lattice of the silicon with that of the GaN to minimize cracking and dislocations. Growing GaN layers over silicon is well-known and there are a variety of ways to do it. The article, Silicon—A New Substrate for GaN Growth, S. Pal et al., Bulletin of Materials Science, December 2004, Vol. 27, issue 6, pp. 501-504, describes various ways to form GaN layers over silicon and is incorporated herein by reference. The technology has become much more commonplace and mature since the 2004 article. In one example, the interface layer 42 comprises a thin layer of Al followed by an AlN seed layer, followed by an AlGaN or AlInGaN buffer layer which may include a gradation of components to ultimately match the lattice constant of the LED layers. In one embodiment, the LED layers are AlInGaN so as to emit blue light. The LED 14 may be a heterojunction LED with a P-type layer 44, a thin active layer 46, and an N-type layer 48. The electrons and holes combine in the active layer 46 to emit a peak wavelength that depends on the material used to form the active layer 46. N+ and P+ contact layers may be formed on the layers 44 and 48 for making ohmic contact with metal. Forming heterojunction GaN-based LEDs over a silicon substrate is well-known to those skilled in the art of LED fabrication.

A GaN, GaAs, or SiC substrate may also be used.

Next, a dielectric 50 is patterned to insulate the various metal portions.

A metal layer is then patterned to form a source metal 52 that contacts the N+ source region 28, P+ body contact region 30, and top surface of the P-type layer 44. The source metal 52 thus connects the LED 14 in series with the transistor 12. An edge portion of the P-type layer 44 is exposed by etching away a portion of the N-type layer 48.

Over the N-type layer 48 may be formed a transparent conductor layer, such as ITO or sintered nano-wires, to uniformly spread the current while allowing light to exit the LED 14. The cathode electrode 54 metal, conducting current to the cathode of the LED 14, may be formed along edges of the transparent conductor layer or form metal fingers or a star pattern to apply current to the N-type layer 48 while allowing light to exit the LED 14. The cross-section of FIG. 2 cuts through the opaque metal cathode electrode 54, and other cross-sections may not show any opaque metal layer 54 over the N-type layer 48. The bottom surface of the substrate 24 may be thinned and metallized to form an anode electrode 57.

A light ray 58 is shown being emitted by the active layer 46 and exiting through a transparent surface of the N-type layer 48.

Example top views of the structure of FIG. 2 are shown in FIGS. 10 and 11, described later.

Figure 3:
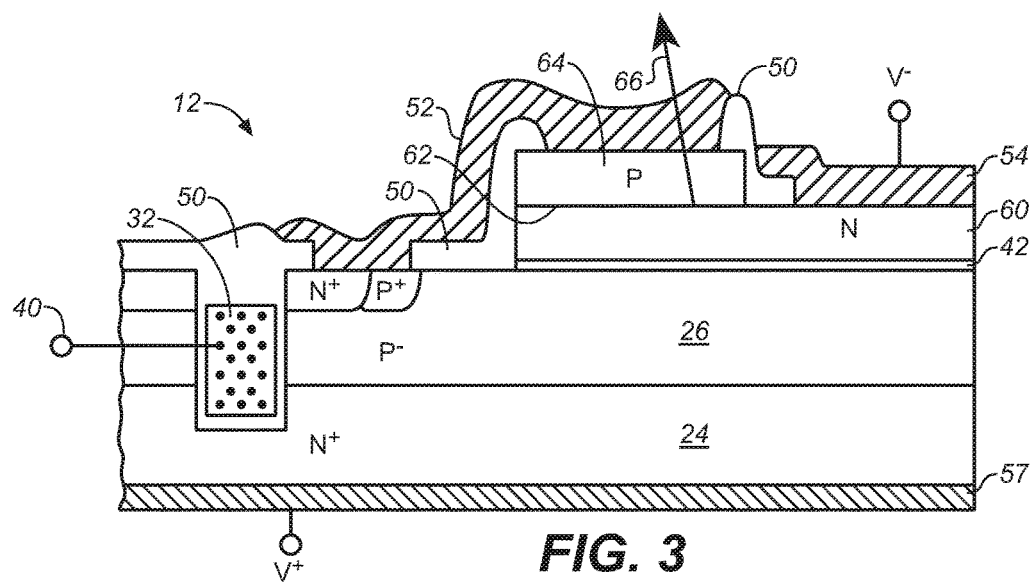
FIG. 3 illustrates the LED/driver module of FIG. 2 but where the LED layers are reversed.

FIG. 3 illustrates the same transistor 12 as in FIG. 2 but the LED has a GaN-based N-layer 60 formed over the interface layer 42, followed by forming the active layer 62 and the P-type layer 64 over the N-type layer 60. In this example, the source metal 52 must be formed so as to not block a significant amount of light from the top of the P-type layer 64. The same techniques described with respect to FIG. 2 may be used to enable light to escape through the P-type layer 64 while the source metal 52 supplies current to the P-type layer 64.

When the die is forward biased and a sufficient gate voltage is applied to the gate electrode 40, the P– type body region inverts next to the gate 32 to form a vertical conductive channel between the N+ source region 28 and the N+ substrate 24 to conduct a current through the LED 14 to turn it on. Since the substrate 24 may be highly conductive and very thin, and the channel has high conductivity, there is very little power loss (and heat) generated by the current.

Figure 4:
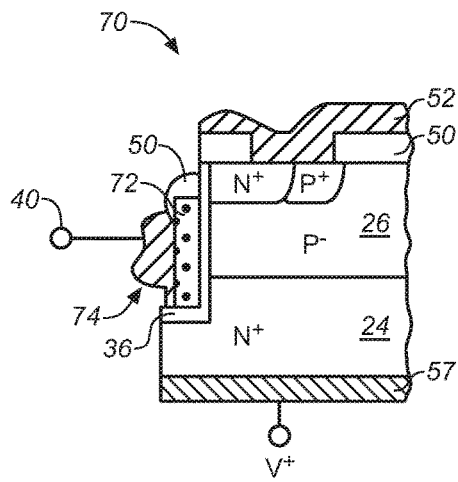
FIG. 4 illustrates a trenched vertical NMOS driver transistor that may replace the MOSFET portion in FIG. 2 or 3.

FIG. 4 illustrates another type of vertical NMOS transistor 70 that may be used instead of the NMOS transistor 12 in FIGS. 2 and 3. The LED portion and its connections may be the same as in FIG. 2 or 3.

In FIG. 4, the conductive gate 72 in the trench 74 surrounds the LED portion and forms part of the side of the die. The gate electrode 40 may form a metal ring around the die for contacting a metal electrode in a receptacle or other electrical contact. The dies may be arranged in a desired pattern on a conductive substrate to supply the positive voltage to the die, and a dielectric material may be deposited within the gaps to insulate the conductive substrate. A conductive material may then fill the gaps to contact the gate electrodes 40. Another dielectric layer may insulate the top of the gate conductors, and a top conductor layer may be patterned to electrically contact the top electrode.

Many other designs are envisioned.

Figure 5:
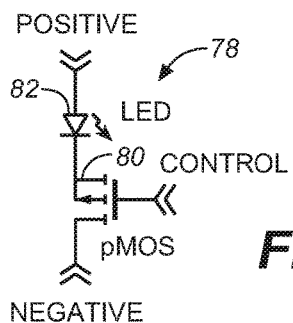
FIG. 5 is a schematic diagram of a PMOS driver transistor connected to the cathode of an LED.

FIG. 5 is a schematic diagram of an LED/drive module 78 with a PMOS transistor 80 in series with an LED 82 and connected to the cathode of the LED 82.

Figure 6:
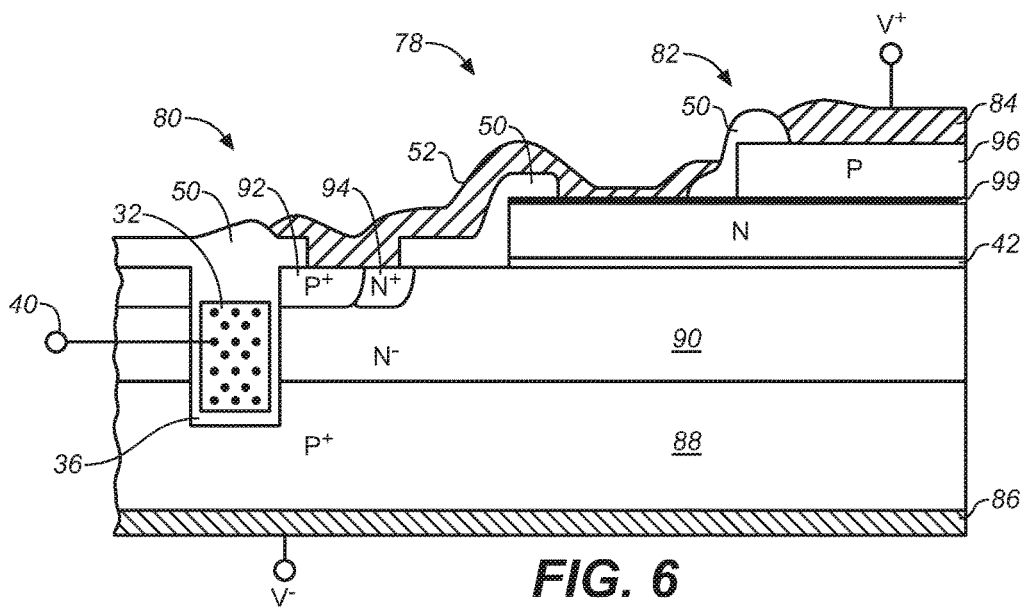
FIG. 6 is a cross-sectional view of a portion of an LED/driver module, where a trenched vertical PMOS driver transistor is used, corresponding to the diagram of FIG. 5.

FIG. 6 is a cross-sectional view of a portion of the LED/driver module 78, where a trenched vertical PMOS driver transistor 80 is used, corresponding to the diagram of FIG. 5. The structure is the same as in FIG. 2 but the polarity of the materials used to form the PMOS transistor 80 and LED 82 are reversed, which means the anode electrode 84 is the top electrode and the cathode electrode 86 is the bottom electrode connected to the P+ substrate 88 drain.

In FIG. 6, the substrate 88 is P+, the body region 90 is N−, the source region 92, is P+, and the body contact region 94 is N+. The LED P-type layer 96 is formed over the N-type layer 98, with an active layer 99 therebetween. Light escapes through the P-type layer 96.

Figure 7:
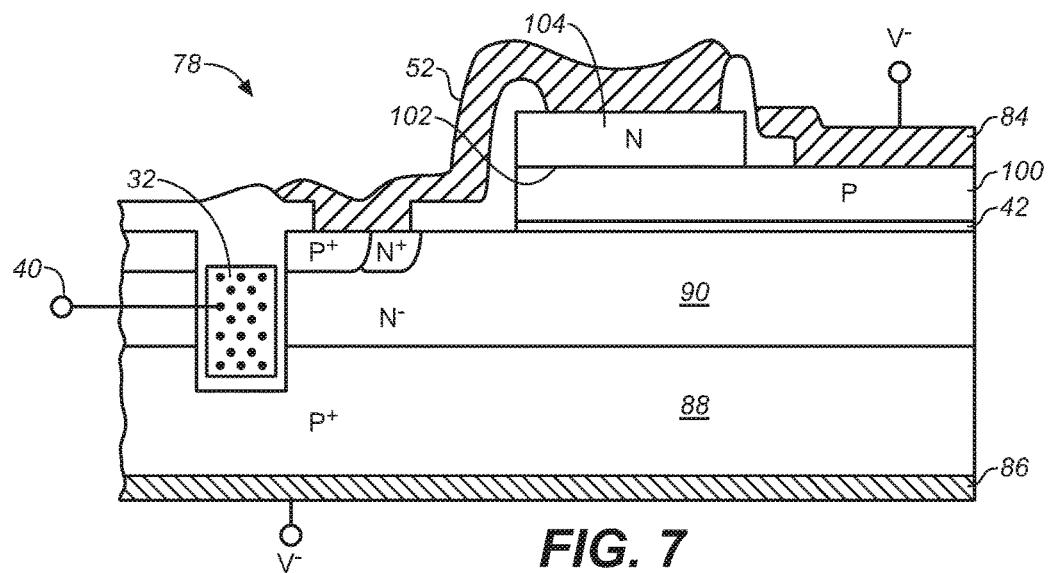
FIG. 7 illustrates the LED/driver module of FIG. 6 but where the LED layers are reversed.

FIG. 7 illustrates the LED/driver module 78 of FIG. 6 but where the LED layers are reversed. The P-type layer 100 is formed over the interface layer 42, followed by the active layer 102, and the N-type layer 104.

Figure 8:
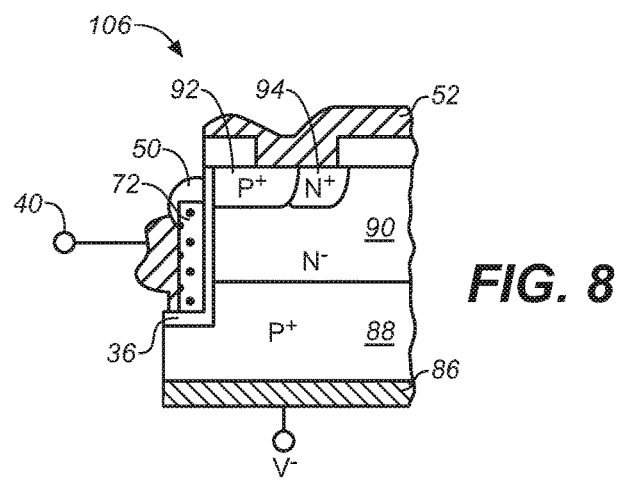
FIG. 8 illustrates a trenched vertical PMOS driver transistor that may replace the MOSFET portion in FIG. 6 or 7.

FIG. 8 illustrates a trenched vertical PMOS driver transistor 106 that may replace the MOSFET portion in FIG. 6 or 7. It is identical to the transistor of FIG. 4 except that the polarities are reversed. By using this type of transistor, the gate electrode 40 may be formed around the perimeter of the die, and the die may be smaller.

FIG. 9 is similar to FIG. 2 but the NMOS driver transistor 106 is formed as a DMOS transistor having a diffused P-type well region 108. All transistors may be DMOS transistors, using a double diffusion of dopants. An N+ substrate 24 having an upper lightly doped N-layer 109 is used to form the DMOS transistor, where the P-type well region 108 is formed in the N-layer 109, and the gate 32 may optionally extend to the N+ substrate 24 portion for a lower on-resistance.

FIG. 10 is a top down view of an LED/driver die 110 having a hexagonal footprint, where the MOSFET driver portion 112 surrounds the LED portion 114 for uniform injection of current into the LED. In another embodiment, the MOSFET driver portion forms the middle portion 114 surrounded by the LED portion.

FIG. 11 is a top down view of an LED/driver die 116 having a square footprint, where the MOSFET driver portion 118 surrounds the LED portion 120 for uniform injection of current into the LED. In another embodiment, the MOSFET driver portion forms the middle portion 120 surrounded by the LED portion.

In one embodiment, the size (footprint) of the LED module die is about 0.05 mm$^2$–1 mm$^2$. If the modules are to be printed as an ink, the sizes may be much smaller.

Multiple LED may be form in a single module and may be connected in series and/or parallel. The LEDs may be driven by a single transistor integrated in the module.

The LED module of the present invention may be used in any suitable application, including all of the applications disclosed in the Applicant's U.S. Pat. Nos. 9,577,007 and 9,153,732, both incorporated by reference. One application is to form a compact array of red, green, and blue pixels in a display.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A lighting device formed as a single monolithic die comprising:
    a light emitting diode (LED) having at least a first LED layer of a first conductivity and a second LED layer of a second conductivity, the first LED layer and the second LED layer being epitaxially grown over a top surface of a semiconductor material;
    a MOSFET formed in the semiconductor material, the MOSFET comprising:
        a trench formed in the semiconductor material, the trench having walls;
        a dielectric material insulating the walls of the trench from the semiconductor material;
        a conductive material at least partially filling the trench and forming a gate;
        a source region formed in the top surface of the semiconductor material; and
        a drain;
    a first electrode electrically coupled to the drain on a bottom surface of the semiconductor material;
    a gate electrode electrically coupled to the gate;
    a first conductor electrically connecting the source region to the first LED layer to connect the MOSFET in series with the LED; and
    a second electrode electrically coupled to the second LED layer,
    wherein, when a forward voltage is applied between the first electrode and the second electrode, and a turn-on gate voltage is applied to the gate electrode, a vertical conductive channel is created in the semiconductor material between the source region and the drain to conduct current through the LED to energize the LED.

2. The device of claim 1 wherein the semiconductor material comprises a conductive substrate.

3. The device of claim 2 wherein the substrate comprises silicon and the LED comprises GaN.

4. The device of claim 1 wherein the semiconductor material comprises one of silicon, SiC, GaN, and GaAs.

5. The device of claim 1 further comprising an interface layer between the LED and the top surface of the semiconductor material for epitaxially growing the first LED layer and the second LED layer.

6. The device of claim 5 wherein the first LED layer and the second LED layer comprise GaN.

7. The device of claim 1 wherein the LED surrounds the MOSFET.

8. The device of claim 1 wherein the MOSFET surrounds the LED.

9. The device of claim 1 wherein the MOSFET is a PMOS transistor.

10. The device of claim 1 wherein the MOSFET is an NMOS transistor.

11. The device of claim 1 wherein the gate electrode is exposed along a side of the die substantially perpendicular to the first electrode.

12. The device of claim 1 wherein the trench has an open side for electrical connection of the gate electrode to the conductive material exposed on the open side of the trench.

13. The device of claim 1 wherein the semiconductor material comprises a substrate of the second conductivity type.

14. The device of claim 1 wherein the semiconductor material comprises a substrate of the second conductivity type and a first layer of a first conductivity type over the substrate of the second conductivity type.

15. The device of claim 14 wherein the first layer is an upper layer of the substrate, and a bottom of the substrate is of the second conductivity type.

16. The device of claim 1 wherein the semiconductor material comprises a substrate of the second conductivity type and a first layer of the second conductivity type over the substrate of the second conductivity type, wherein the substrate of the second conductivity type is more highly doped than the first layer of the second conductivity type.

17. The device of claim 1 wherein the MOSFET is a DMOS type MOSFET, the device further comprising:
   a well region of the first conductivity type through which the gate extends; and
   wherein the source region is of the second conductivity type formed in the well region.

18. The device of claim 17 wherein the semiconductor material comprises a substrate of the second conductivity type and a first layer of the second conductivity type over the substrate of the second conductivity type, wherein the substrate of the second conductivity type is more highly doped than the first layer of the second conductivity type, and wherein the well region is formed in the first layer.

19. The device of claim 18 wherein the gate extends through the well region, the first layer, and into the substrate of the second conductivity type.

20. The device of claim 1 wherein the die is printable in a solution.

* * * * *